US007746065B2

(12) United States Patent
Pastre et al.

(10) Patent No.: US 7,746,065 B2
(45) Date of Patent: Jun. 29, 2010

(54) CONTINUOUSLY CALIBRATED MAGNETIC FIELD SENSOR

(75) Inventors: Marc Pastre, Ecublens (CH); Hubert Blanchard, Vevey (CH); Maher Kayal, St-Sulpice (CH)

(73) Assignee: Liaisons Electroniques-Mecaniques LEM S.A., Plan-les-Ouates (CH)

( * ) Notice: Subject to any disclaimer, the term of this patent is extended or adjusted under 35 U.S.C. 154(b) by 594 days.

(21) Appl. No.: 11/663,136

(22) PCT Filed: Sep. 14, 2005

(86) PCT No.: PCT/IB2005/002856

§ 371 (c)(1),
(2), (4) Date: Mar. 16, 2007

(87) PCT Pub. No.: WO2006/056829

PCT Pub. Date: Jun. 1, 2006

(65) Prior Publication Data

US 2007/0247141 A1    Oct. 25, 2007

(30) Foreign Application Priority Data

Sep. 16, 2004    (EP)    ..................... 04405584

(51) Int. Cl.
*G01R 33/06*    (2006.01)
(52) U.S. Cl. ..................... 324/202; 324/260
(58) Field of Classification Search ........... 324/202, 324/260
See application file for complete search history.

(56) References Cited

U.S. PATENT DOCUMENTS

| 4,037,150 A | 7/1977 | Taranov et al. |
| 4,752,733 A | 6/1988 | Petr et al. |

FOREIGN PATENT DOCUMENTS

DE    100 62 292 A1    3/2002

OTHER PUBLICATIONS

Simon, P.L.C., De Vries, P.H.S., Middelhoek, S., Autocalibration of Silicon Hall Devices, Sensors and Actuators A, Elsevier Sequoia S.A., Lausanne, CH, vol. A52, No. 1/3, Mar. 1, 1996, pp. 203-206, XP000599994, ISN: 0924-4247.
Demierre, M., Pesenti, S., Frounchi, J., Besse, P.A., Popovic, R.S., Reference Magnetic Actuator for Self-Calibration of a Very Small Hall Sensor Array, Sensors and Actuators A, Elsevier Sequoia S.A., Lausanne, CH, vol. 97-98, Apr. 1, 2002, pp. 39-46, XP004361580, ISSN: 0924-4247.

*Primary Examiner*—Reena Aurora
(74) *Attorney, Agent, or Firm*—Baker & Daniels LLP

(57) ABSTRACT

A magnetic field sensor comprises a reference magnetic field generator (8), a magnetic field sensing cell (6) including Hall effect sensing elements (12), and a signal processing circuit (4) connected to the output (11) of the magnetic field sensing cell and comprising one or more feedback lines (27, 28) for correcting error fluctuations in the transfer characteristic of the magnetic field sensor. The reference magnetic field generator is adapted to generate a frequency modulated reference magnetic field. The signal processing circuit further includes a modulator connected to the magnetic field sensing cell, adapted to modulate the output signal thereof at a frequency different from the modulation frequency of the reference magnetic field generator.

21 Claims, 11 Drawing Sheets

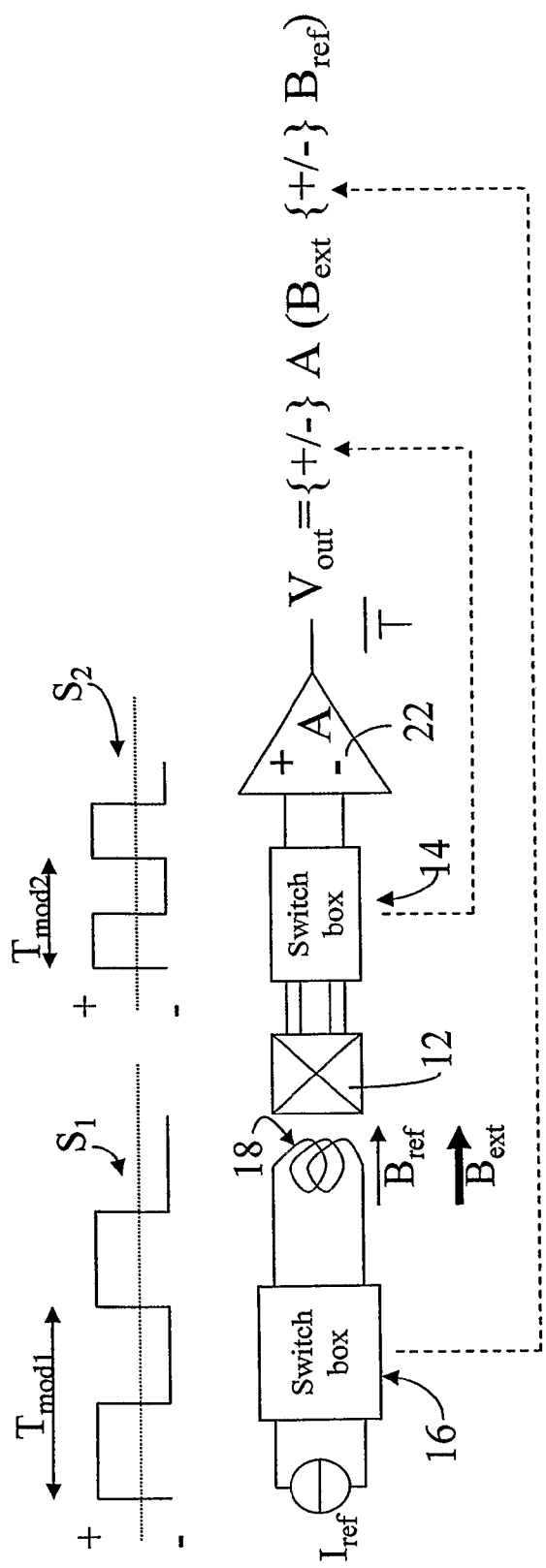
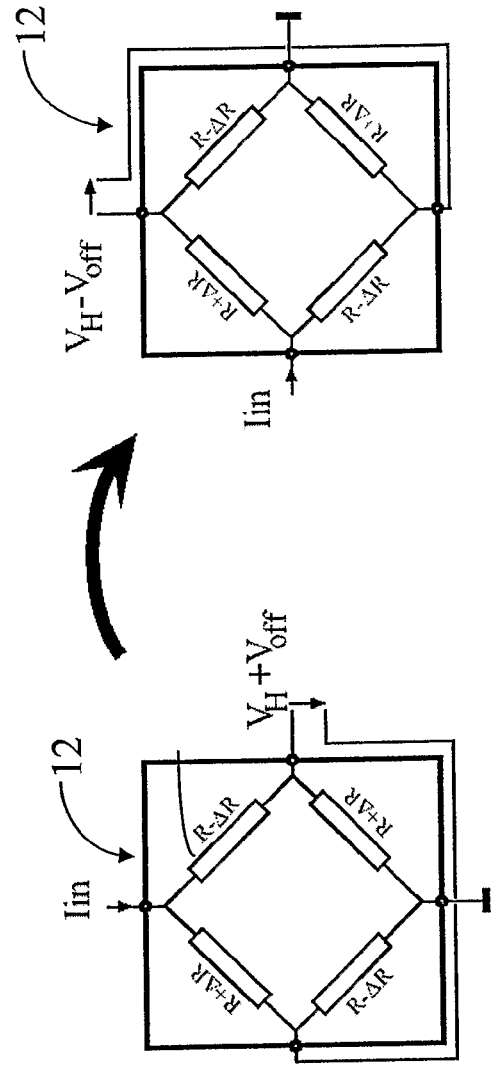
Fig. 2a
Fig. 2b

| Phase | Amplifier | Reference | Amp. output | Sig. Demod | Ref. Demod |
|---|---|---|---|---|---|
| 1 | + | + | $+(B_{ext} + B_{ref})$ | + | + |
| 2 | − | + | $-(B_{ext} + B_{ref})$ | − | − |
| 3 | + | − | $+(B_{ext} - B_{ref})$ | + | − |
| 4 | − | − | $-(B_{ext} - B_{ref})$ | − | + |
|   |   |   |   | $4\,B_{ext}$ | $4\,B_{ref}$ |

Fig. 7a

| Phase | Amplifier | Reference | Amp. output | Sig. Demod | Ref. Demod |
|---|---|---|---|---|---|
| 1 | + | + | $+(B_{ext} + B_{ref})$ | + | + |
| 2 | + | − | $+(B_{ext} - B_{ref})$ | + | − |
| 3 | − | + | $-(B_{ext} + B_{ref})$ | − | + |
| 4 | − | − | $-(B_{ext} - B_{ref})$ | − | − |
|   |   |   |   | $4\,B_{ext}$ | $4\,B_{ref}$ |

Fig. 7b

| Phase | Amplifier | Reference | Amp. output | Sig. Demod | Ref. Demod |
|---|---|---|---|---|---|
| 1 | + | 0 | $+(B_{ext})$ | + | 0 |
| 2 | - | 0 | $-(B_{ext})$ | - | 0 |
| 3 | + | + | $+(+B_{ref})$ | 0 | + |
| 4 | - | - | $-(-B_{ref})$ | 0 | - |
| | | | | $2\,B_{ext}$ | $2\,B_{ref}$ |

Fig. 7c

| Phase | Amplifier | Reference | Amp. output | Sig. A | Sig B |
|---|---|---|---|---|---|
| 1 | + | + | $+(B_{ext}+B_{ref})$ | | + |
| 2 | - | + | $-(B_{ext}+B_{ref})$ | - | |
| 3 | + | - | $+(B_{ext}-B_{ref})$ | + | |
| 4 | - | - | $-(B_{ext}-B_{ref})$ | | - |
| | | | | $2\,B_{ext}$ | $2\,B_{ext}$ |

Fig. 7d

CONTINUOUSLY CALIBRATED MAGNETIC FIELD SENSOR

The present invention relates to a magnetic field sensor that is continuously calibrated to compensate for fluctuations in the transfer characteristic due to factors, such as temperature, ageing, mechanical stress, and voltage offset. In particular, the gain of the sensor is continuously calibrated in order to remain constant. The present invention also relates to a current sensor that measures the current flowing in an external conductor by means of the magnetic field sensor that is continuously calibrated.

Many magnetic field sensors are calibrated during the manufacturing process to compensate for voltage offset and temperature drift of the gain of the magnetic field sensor and signal processing circuit. The factory calibration values however cannot compensate for fluctuations of the sensor transfer characteristics originating from factors such as mechanical stress and ageing of the various sensor components and circuitry. The latter drawback may be addressed by calibrating the sensor while it is being used, as described in U.S. Pat. No. 4,752,733.

The magnetic field sensor described in the aforementioned patent comprises a reference magnetic field generator that superimposes, on the magnetic field to be measured, a reference magnetic field, measured by a magnetic field sensing cell, such as a Hall effect cell. Any fluctuations in the transfer characteristic of the magnetic field sensing unit will thus act upon the measurement of the external magnetic field, generated for example by a current to be measured in the case of a current sensor, and the reference magnetic field. As the reference magnetic field is known, the measurement signal generated by the magnetic field sensor should have a corresponding specific value and any variation therefrom can be used in a feedback loop to correct the transfer characteristic of the magnetic field sensing cell.

One of the problems of the sensors described in U.S. Pat. No. 4,752,733 is that the reference signal is either incorporated in the measurement signal at the output of the sensor, or an attenuator is included in the circuit to remove the reference signal so that it does not pollute the signal to be measured.

In another variant described in the aforementioned US patent, separate Hall cells coupled to different reference coils are provided. These solutions for removing the reference signal are difficult to implement and also subject to variations due to temperature and other factors. A further drawback of the current sensor described in U.S. Pat. No. 4,751,733 is its limited measurement bandwidth, in particular it is not designed to measure high frequency electrical currents, for example at a frequency of up to 100 kHz In view of the aforegoing, an object of this invention is to provide a magnetic field sensor that is reliable and remains accurate over time.

It is a further object to provide an electrical current sensor including a magnetic field sensor that is reliable and remains accurate over time.

It is advantageous to provide an electrical magnetic current sensor that is able to accurately measure electrical currents over a large frequency bandwidth, such as from 0 to 100 kHz.

It is advantageous to provide a magnetic field sensor that is accurate and remains accurate even when subject to variations in mechanical and thermal stress.

It is advantageous to provide a magnetic field sensor that is economic to manufacture on an industrial scale.

Objects of this invention have been achieved by providing a magnetic field sensor comprising a reference magnetic field generator, a magnetic field sensing cell including a magnetic field sensing element, and a signal processing circuit connected to an output of the magnetic field sensing cell and comprising one or more feedback lines for correcting error fluctuations in the transfer characteristic of the magnetic field sensor. The reference magnetic field generator is adapted to generate a frequency modulated reference magnetic field, wherein the signal processing circuit further includes a modulator connected to the magnetic field sensing cell, the modulator modulating the output signal thereof at a frequency different from the modulation frequency of the reference magnetic field generator according.

Disclosed herein is a magnetic field sensor comprising a reference magnetic field generator, a magnetic field sensing cell, and a signal processing circuit connected to the output of the magnetic field sensing cell and comprising one or more feedback loops for correcting variations in the transfer characteristic of the magnetic field sensing cell. The reference magnetic field generator generates a frequency modulated reference magnetic field, whereas the signal processing circuit comprises a modulator connected to the output of the magnetic field sensing cell that modulates the output signal thereof at a frequency different from the modulation frequency of the reference magnetic field generator.

Objects of this invention have also been achieved by a method of measuring magnetic field including the steps of superimposing a modulated reference magnetic field on the external magnetic field, modulating the output signal of a magnetic field sensing cell at a frequency different from the modulation frequency of the reference magnetic field, and adding or subtracting different phases of the modulated signal in order to separately extract a measurement signal corresponding to the external magnetic field and a reference signal corresponding to the reference magnetic field.

Disclosed herein is a method of measuring an external magnetic field, including the steps of superimposing a modulated reference magnetic field on the external magnetic field, modulating the output signal of the magnetic field sensing cell at a frequency different from the modulation frequency of the reference magnetic field, one of the frequencies being an integer multiple of the other, and adding or subtracting different phases of the modulated signal in order to extract a measurement signal corresponding to the external magnetic field and a reference signal corresponding to the reference magnetic field.

Advantageously, the magnetic field sensor and method of measuring an external magnetic field according to this invention allows the reference signal to be accurately, simply and reliably separated from the measurement signal, so that it can be used in a feedback loop to compensate for error fluctuations in the magnetic field sensing cell transfer characteristic and at the same time produce an output sensor signal that is free of the reference field component.

The modulation frequency of the magnetic field sensing cell signal may be an even multiple or factor of the modulation frequency of the reference magnetic field, and is preferably a factor half or a multiple two thereof. The magnetic field sensing cell may advantageously comprise a plurality of magnetic field sensing elements, preferably Hall effect elements arranged in an integrated circuit and connected through the frequency modulators to an operational amplifier. The operational amplifier may advantageously be a differential difference amplifier (DDA) that adds and amplifies the differences of the signal outputs of the plurality of magnetic field sensing elements. Use of an array of magnetic field sensing elements advantageously improves the accuracy of the reference signal extraction when it has a significantly smaller amplitude (factor $10^2$ to $10^4$ times smaller) than the signal to be measured.

The latter can be achieved by having at least two reference coils associated to two magnetic field sensing elements, whereby the reference magnetic field is in opposite directions on the magnetic field sensing elements. The subtraction (difference) of one signal from the other thus results in a value of two times the reference signal. A unidirectional external magnetic field, namely the signal generated by the current to be measured, is however cancelled by the subtraction of the signals from the two magnetic field sensors.

The modulation of the reference coil and magnetic field sensing cell output cancels the effect of the sensing cell and amplifier offsets. However, in order to prevent saturation of amplifiers and demodulators, the offset signals can advantageously be corrected in a feedback loop from an output of the operational amplifier to an offset control input of the operational amplifier. The offset correction may thus be separately performed from the gain correction, which compensates variations due to mechanical stress, thermal drift and other factors influencing the accuracy of the magnetic field sensing cell. This in particular allows a more accurate and responsive correction of offset and drift.

The signal processing circuit may advantageously comprise a low pass filter after the demodulator on the output signal line of the magnetic field sensor in order to attenuate the high frequency components generated by the modulation and demodulation. The signal processing circuit may also advantageously comprise a low pass filter after or combined with the demodulator on the gain correction feedback line of the magnetic field sensor in order to attenuate the high frequency external signal elements aliased by the modulation. The magnetic field sensing cell and sensor circuit have a natural attenuation of low frequency interference signal components, leading to a high pass like parasitic transfer function. By appropriately adjusting the low pass filter on the gain correction feedback line with a low cut-off frequency, the bandwidth of the parasites is limited, thus increasing the signal to noise ratio. The reference signal remains unchanged by the filter.

Further objects and advantageous features of the invention will become apparent from the claims, the following description, and the drawings in which:

FIG. 2a is a block diagram schematically illustrating the reference magnetic field generator, magnetic field sensor cell, and operational amplifier according to a simplified version of the invention;

FIG. 2b is a simplified schema illustrating the switching of a Hall sensor element for modulating the sensor cell signals;

FIG. 4b is a graph showing control signals of switches, as a function of time, of the demodulator of FIG. 4a;

FIGS. 7a, 7b, 7c, 7d are tables showing different modulation/demodulation schemes to extract the reference signal and the measurement signal by combining different successive phases of the modulated signal.

Figure 1A:
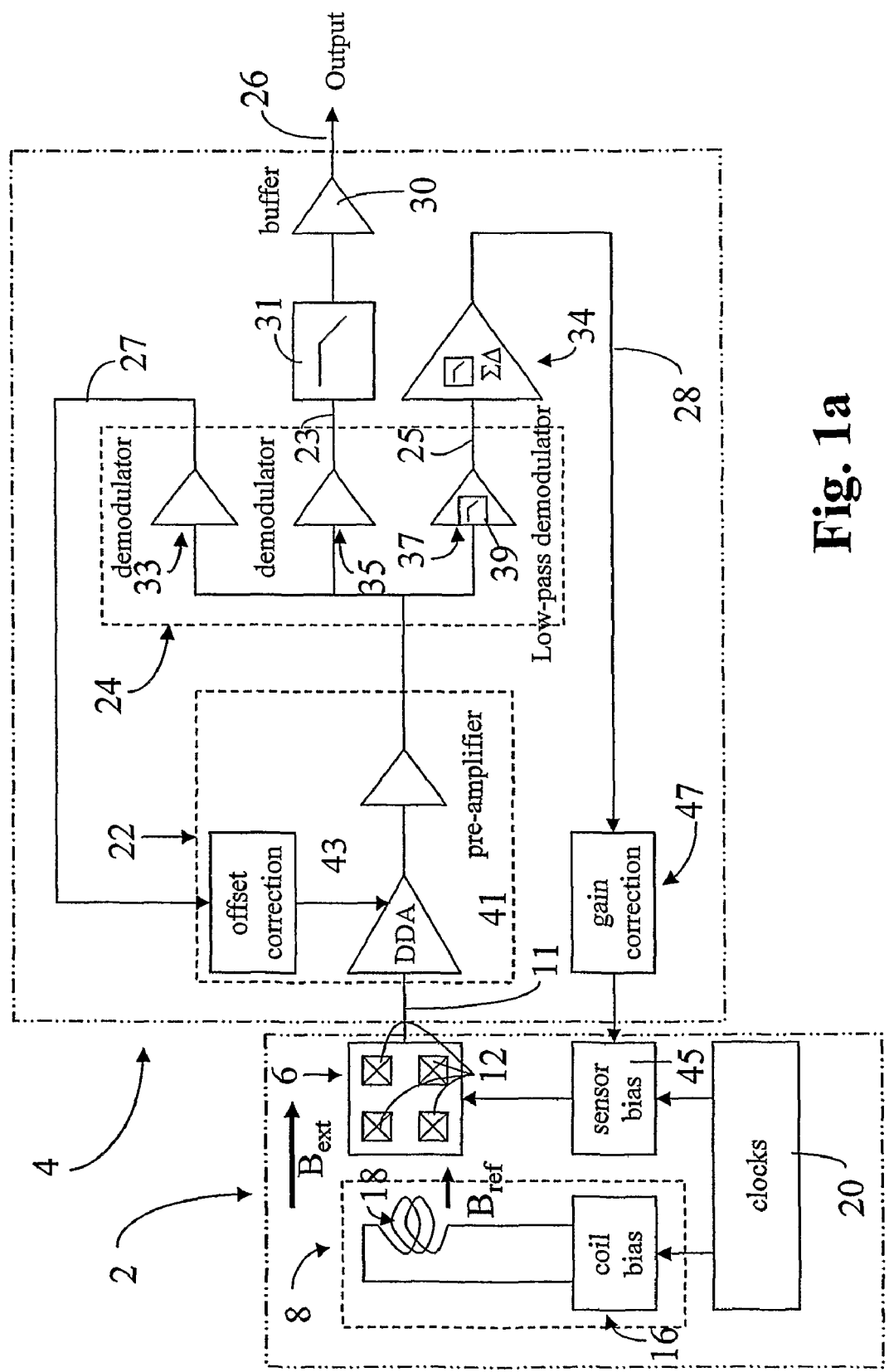
FIGS. 1a and 1b are block diagrams schematically illustrating the overall circuit and elements of the magnetic field sensor according to first and second variants respectively, of this invention.

Referring first to FIGS. 1a to 3, the electrical magnetic field sensor according to this invention comprises generally a magnetic field sensing circuit 2 and a signal processing circuit 4. The magnetic field sensing circuit 2 comprises a magnetic field sensing cell 6, a reference magnetic field generator 8, and a gain correction input 10.

The magnetic field sensing cell 6 may comprise one or a plurality of magnetic field sensing elements 12, for example a Hall effect sensor or an array of Hall effect sensors formed in an integrated circuit as is known in the art, the magnetic field sensing cell 6 further comprising a modulator 14 for modulating the output signal of each magnetic field sensing element 12. The reference magnetic field generator 8 comprises a modulated reference current input 16 driving one or a plurality of reference coils 18 for the purposes of generating a reference magnetic field $B_{ref}$ applied to each magnetic field sensing element 12. The frequency at which the reference coil and magnetic field sensor signal modulators are driven are controlled by clocks 20, whereby the clock frequency of the magnetic field sensing cell modulator 14 is preferably an even factor or multiple, for example one half or two, of the clock frequency controlling the reference coil modulator. The modulators 14, 16 may be in the form of switches or an arrangement of switches that change the polarity of the signals. A graphical representation $S_1$, $S_2$ of the variation in the polarity of the signals created by the switching of the reference coil current and sensor signal current, respectively, is shown in FIG. 2a.

Figure 1B:
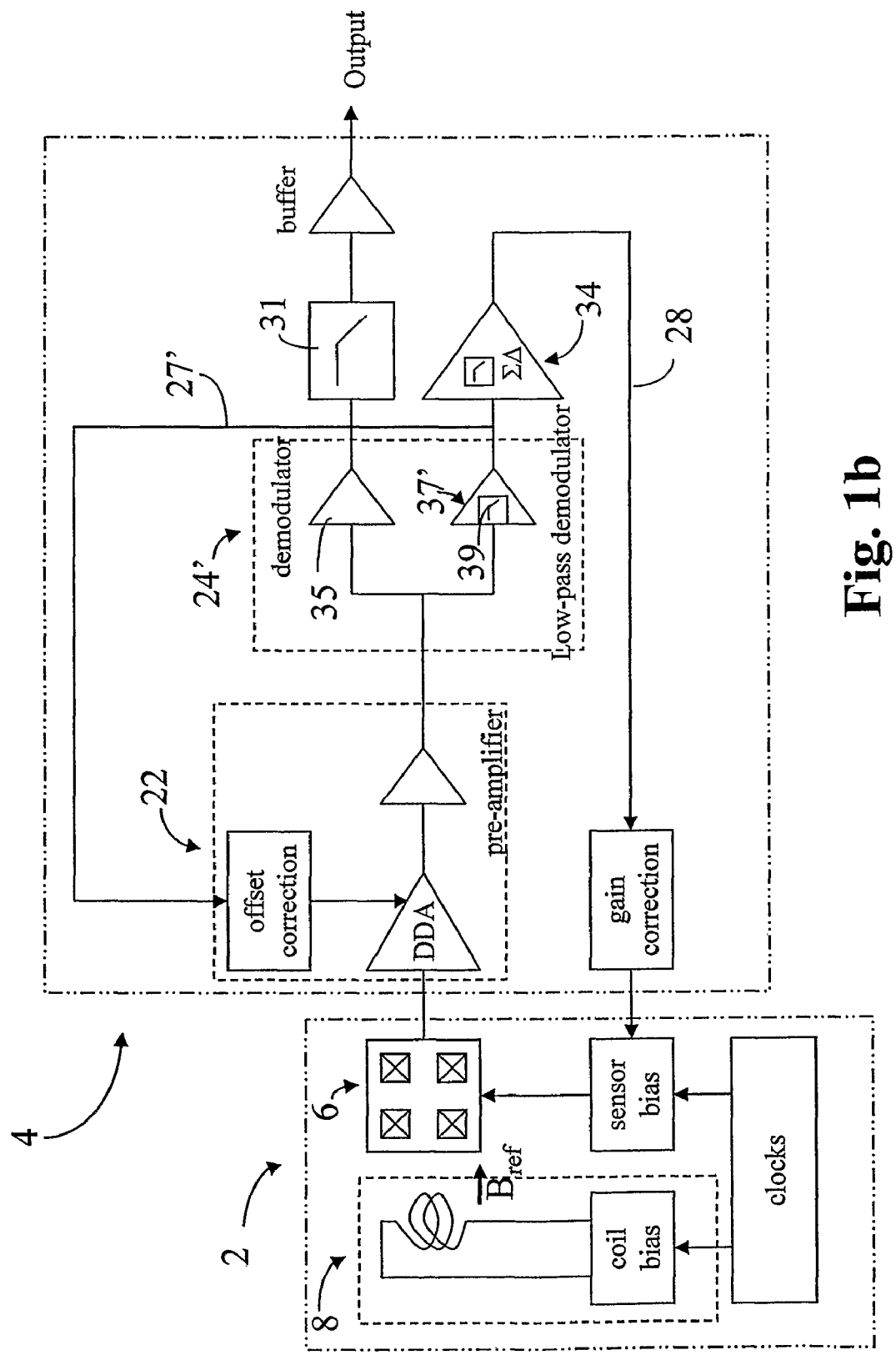

Referring to FIG. 1a and 1b, the signal processing circuit 4 comprises an amplifier circuit portion 22, connected to the outputs 11 of the magnetic field sensing cell 6, a demodulating circuit portion 24, 24' and a feedback loop 28 for gain correction feeding back to the input of the magnetic field sensing cell 6. The demodulating circuit portion has a demodulator 35 with an output 23 leading to the magnetic field sensor output 26, a demodulator 37 with an output 25 leading into the gain correction feedback line 28, and a demodulator 33 with an output leading into an offset correction feedback line 27.

In the embodiment of FIG. 1a, separate demodulators 33, 37 are used for offset correction and gain correction to improve accuracy and responsiveness. A single demodulator 37' could however be used, as shown in FIG. 1b, the output of which feeds into the offset correction feedback line 27' and gain correction feedback line 28. It would further be possible to have only a single demodulator for the feedback lines and the sensor output line 26 by adapting the demodulation scheme to intermittently produce the output signal and offset correction signals. In other words, connected to the pre-amplifier output can be as many demodulators as necessary to demodulate the different components present in the signal:

The measurement of the external magnetic field $B_{ext}$

The measurement of the reference magnetic field $B_{ref}$ used to calibrate the gain The sensor and preamplifier offset Each of these signal components can be extracted by a separate demodulator as shown in FIG. 1a, or some of them can be extracted one after another by the same demodulator applying different demodulation schemes on a periodic time basis as shown in FIG. 1b.

The sensing cell signal modulator 14 may comprise a switch arrangement that changes the signs of the offset ($V_{off}$) and the sensing cell signal ($V_H$) in order to obtain the four combinations $V_H+V_{off}$, $V_H-V_{off}$, $-V_H+V_{off}$, and $-V_H-V_{off}$.

Referring to FIG. 2b, the change in the sign of the offset can be obtained using the fact that a Hall sensing element with a shape invariant under a rotation through 90° (such as a square or a cross) has an offset ($V_{off}$) that is inverted when the current input $I_{in}$ is rotated 90°, whereas the Hall voltage ($V_H$) remains the same. The inversion of the Hall voltage can be obtained by inverting the output reading of the Hall sensing element 12. By appropriate change in the connections, one can thus obtain the four following combinations $V_H+V_{off}$, $V_H-V_{off}$, $-V_H+V_{off}$, and $-V_H-V_{off}$. The changes in the connections of the Hall sensing elements 12 can be managed by the switch boxes 14.

The signal processing circuit may comprise a low pass filter 31 on the measurement signal output line 26, after the demodulator, and optionally a buffer 30 in the form of an operational amplifier to adapt the signal amplitude to the specifications of the electronic circuit of the device to which the sensor is connected.

The signal processing circuit may further comprise a low pass filter 39 on the gain correction feedback line 28, after or combined with the demodulator 37, in order to reduce the signal components that are aliased in the reference band due to modulation.

The signal processing circuit may further comprise an analog-digital (A/D) converter 34, for example in the form of a sigma-delta converter 34 after the demodulator 39 on the gain correction feedback line 28.

With reference to FIG. 2a in particular, the general principle of the modulation scheme applied in this invention will now be described.

The modulation scheme applied in this invention uses a double-modulated reference signal, whereby the magnetic field sensor signal modulator 16 chops the modulated reference magnetic field signal at an even multiple or division with the aim of extracting information from the amplified signal, in particular to extract the measurement signal and the reference signal. The offset can also by extracted by appropriate demodulation. The modulated signal is used to eliminate undesirable deviations, such as offset. For example, instead of amplifying $V_{out}=A \cdot V_{in}+V_{offset}$ one amplifies in two phases by inverting the input:

$$V_{out1}=A \cdot (+V_{in})+V_{offset} \quad (1)$$

$$V_{out2}=A \cdot (-V_{in})+V_{offset} \quad (2)$$

and combining the two phases:

$$V_{out}=V_{out1}-V_{out2}=2 A V_{in} (+0 \cdot V_{offset}) \quad (3)$$

thus removing the offset voltage and extracting the true input.

It may be noted that it is also possible to isolate the undesirable effect, such as offset, despite the presence of an input signal, since:

$$V_{out1}+V_{out2}=2 V_{offset} \quad (4)$$

In the present invention, voltage offset may thus be corrected in a feedback loop from the output of the amplifier circuit portion 22 fed back into the offset control input 43 of the differential difference amplifier (DDA) 41 using simply two phases of the modulated output signal. This allows a more direct and responsive correction for offset. The gain drift of the magnetic field sensors due to temperature, mechanical stress and ageing may be corrected with the gain correction feedback loop 28, as shown in FIGS. 1a and 1b.

The extraction of information for the gain correction feedback loop and for the output measurement signal is further explained below, with reference in particular to FIG. 2a.

The reference signal $V_{ref}$ resulting from the reference magnetic field $B_{ref}$ is added to the measurement signal $V_{ext}$ resulting from the external magnetic field $B_{ext}$, which is the signal to be measured, and this signal is modulated 16 with a periodic change of polarity ($S_1$) (sign) at a frequency that is for example half the frequency of the change of polarity ($S_2$) of the magnetic field sensor modulator 14. We thus have:

$$V_{out} = A \cdot (\pm) (V_{ext} \pm V_{ref}) + V_{offset} \quad (5)$$
$$\phantom{V_{out} = A \cdot} \uparrow \phantom{(V_{ext}} \uparrow$$
$$\phantom{V_{out} = A \cdot\ } S_2 \phantom{(V_{ex}} S_1$$

whereby the signs $S_1$ and $S_2$ vary at different frequencies as illustrated in FIG. 2a.

In FIG. 2a, $T_{mod1}$ is the period of the first modulator and $T_{mod2}$ is the period of the second modulator. There is therefore a cyclical repetition at a frequency of $1/T_{mod2}$ or $2/T_{mod1}$ of the four successive phases $p_1$, $p_2$, $p_3$, and $p_4$. The respective outputs corresponding to the four phases are:

$$V_{out1}=A \cdot (+) (V_{ext}+V_{ref})+V_{offset}=A V_{ext}+A V_{ref}+V_{offset} \quad (6)$$

$$V_{out2}=A \cdot (-) (V_{ext}+V_{ref})+V_{offset}=-A V_{ext}-A V_{ref}+V_{offset} \quad (7)$$

$$V_{out3}=A \cdot (+) (V_{ext}-V_{ref})+V_{offset}=A V_{ext}-A V_{ref}+V_{offset} \quad (8)$$

$$V_{out4}=A \cdot (-) (V_{ext}-V_{ref})+V_{offset}=-A V_{ext}+A V_{ref}+V_{offset} \quad (9)$$

It is thus possible to extract the following information by adding or subtracting phases:

| | |
|---|---|
| $A \cdot V_{ext}$ | (amplified signal) |
| $A \cdot V_{ref}$ | (amplified reference signal) |
| $V_{offset}$ | (offset voltage) |

A linear combination of the preceding values may also be extracted. A $V_{ext}$ may be calculated by the following linear combination of the four phases:

$$V_{out1}-V_{out2}+V_{out3}-V_{out4}=4 A V_{ext} \quad (10)$$

$A \cdot V_{ref}$ may be obtained by the following combination of the four phases:

$$V_{out1}-V_{out2}-V_{out3}+V_{out4}=4 A V_{ref} \quad (11)$$

In this case, the second period $T_{mod2}$ is inversed during the demodulation in order to obtain the sequence +, −, −, +.

The value of the offset voltage $V_{offset}$ may be obtained by the following combination of the outputs of the four phases:

$$V_{out1}+V_{out2}+V_{out3}+V_{out4}=4 A V_{offset} \quad (12)$$

in which case the demodulation sequence that is used is +, +, +, +.

It may be noted that one can also use the two partial differences, as follows:

$$V_{out,A}=V_{out1}-V_{out2} \quad (13)$$

$$V_{out,B}=V_{out3}-V_{out4} \quad (14)$$

whereby $$V_{out,A} + V_{out,B} = 4 A V_{ext} \quad (15)$$

$$V_{out,A} - V_{out,B} = 4 A V_{ref} \quad (16)$$

without directly using the four output values of the phases $V_{out1}$, $V_{out2}$, $V_{out3}$, $V_{out4}$ but only the partial sums or differences.

Since the reference signal $V_{ref}$ has a known value, it is possible from equations (11) or (16) to determine the gain A. This is of particular interest if the gain varies, for example, due to variations in the transfer characteristic of the magnetic field sensor originating from thermal effects, mechanical stress, or ageing. Measurement error deviations arising from the aforementioned effects may thus be corrected continuously, as the variation of the output $V_{out}$ demodulated according to equation (11) may be observed as a function of time and can thus be stabilized by seeking to maintain the reference signal constant by correcting the gain A in consequence. Thus, if the reference signal $B_{ref}$ is stable and one acts on the gain A to maintain $V_{out}$ according to equation (11) constant, then the gain A will be corrected to compensate for drift.

One may have separate demodulators in order to extract the information on the total gain according to equation (11), but it is also possible to couple the two demodulators in order to simplify their design and to use the partial sums according to equation (16).

The demodulator circuits may be based on switched capacitors in order to easily achieve the addition and subtraction operations necessary for demodulation. This can be demonstrated with reference to FIG. 2a, as follows.

A magnetic field that is measured by the magnetic field detector is $$B = B_{ext} + B_{ref} \quad (17)$$

The potential at the inputs of the amplifier are:

$$V_H = S I_c B + V_{Hoffset} \quad (18)$$

where S is the sensitivity of the magnetic field sensor, $I_c$ is the sensor bias current which is rotated 90° by the switch box periodically at the magnetic field sensor clock frequency, $B_{ref}$ is the reference magnetic field which changes polarity periodically at the reference coil clock frequency which may for example be half the sensor clock frequency, and $V_{Hoffset}$ is the offset voltage generated by the magnetic field sensor at the input of the amplifier 22.

The amplifier 22 amplifies the potential across the amplifier inputs $V_H$ and thus results in the following relations $$\begin{aligned}
V_A &= A_{ampli} \cdot V_H + V_{Aoffset} \\
&= A_{ampli}(SI_C(B_{ext} + B_{ref}) + V_{Hoffset}) + V_{Aoffset} \\
&= A_{ampli} SI_C B_{ext} + A_{ampli} SI_C B_{ref} + \\
&= A_{ampli} V_{Hoffset} + V_{Aoffset} \\
&= \pm A B_{ext} \pm A B'_{ref} + V_{offset}
\end{aligned} \quad (19)$$

$$= A \cdot (\pm)(B_{ext} \pm B'_{ref}) + V_{offset} \quad (20)$$

where
$V_{Aoffset}$ is the offset of the amplifier
$A = A_{ampli} S|I_c|$, $B'_{ref} = |B_{ref}|$ where the gain A is equal to $A_{ampli} S|I_c|$, $B_{ref}$ is equal to $|B_{ref}|$ and the polarities ± correspond to the polarities $S_1$, $S_2$ of the first and second modulators 16, 14, respectively. As equation (20) is equivalent to equation (5), it is possible to stabilize the total gain of the system and render it independent of drift due to temperature, mechanical stress and other factors.

Figure 6A:
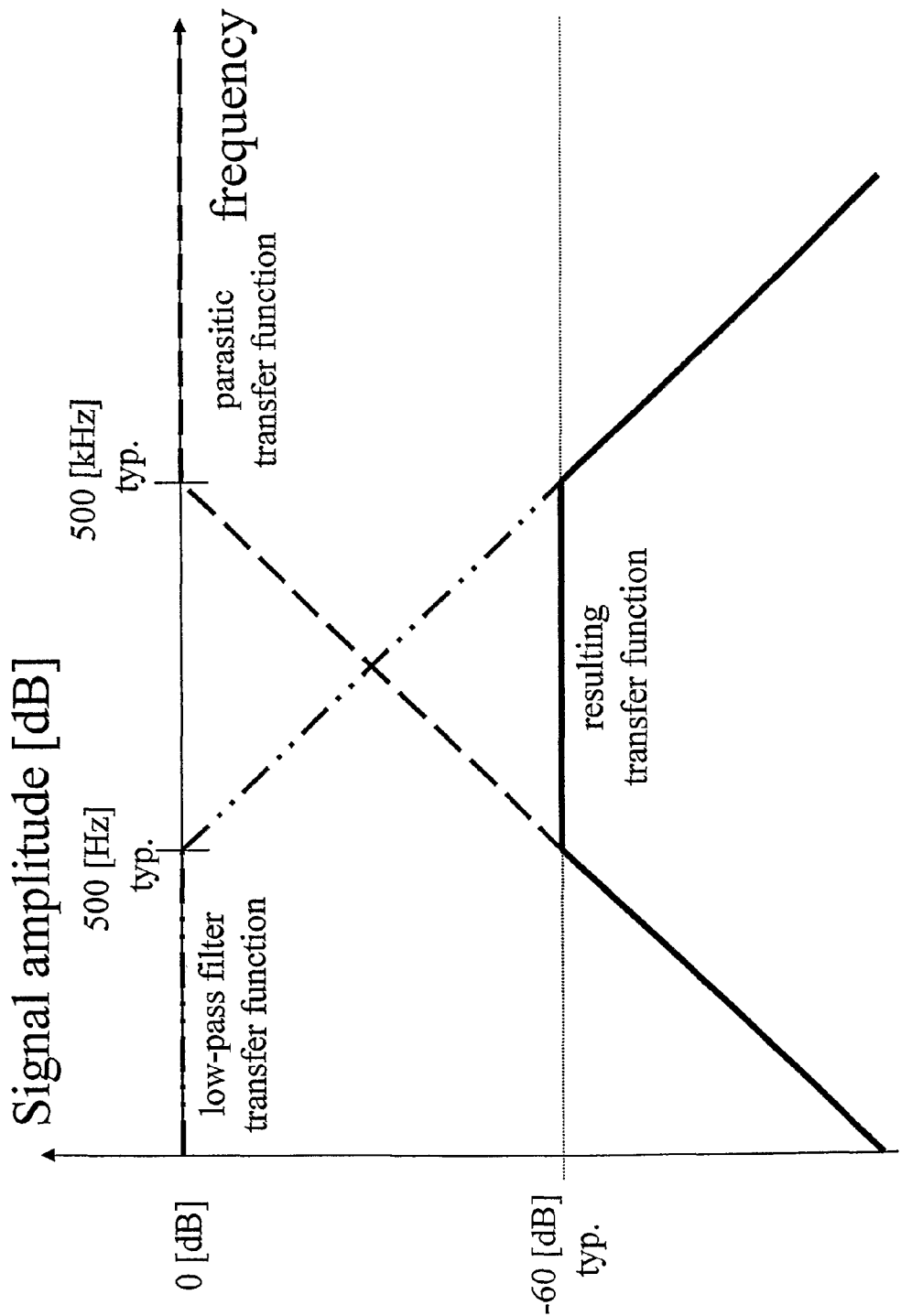
FIG. 6a is a graphical representation of the parasitic signal transfer function of the magnetic field sensor and of a low pass filter.

In the modulation technique discussed above, the measurement signal and reference signals can thus be extracted from the same sensor and amplifier by combining different successive phases by addition or subtraction, for example during demodulation according to the schemes shown in FIGS. 7a and 7b. Both these schemes lead to the same results, however, their circuit performance is somewhat different, as explained below. Using the scheme of FIG. 7b allows the corner frequency of the high-pass like transfer function (as shown in FIG. 6a) to be moved at higher frequency, for example twice the frequency achieved with the scheme of FIG. 7a, however it necessitates the reference coils of the system to be able to operate properly at twice the frequency.

It is also possible to double the signal data rate by combining the successive phases 2 and 3, respectively 4 and 1, as presented in FIG. 7d. The same demodulator is used to perform these operations.

Figure 3:
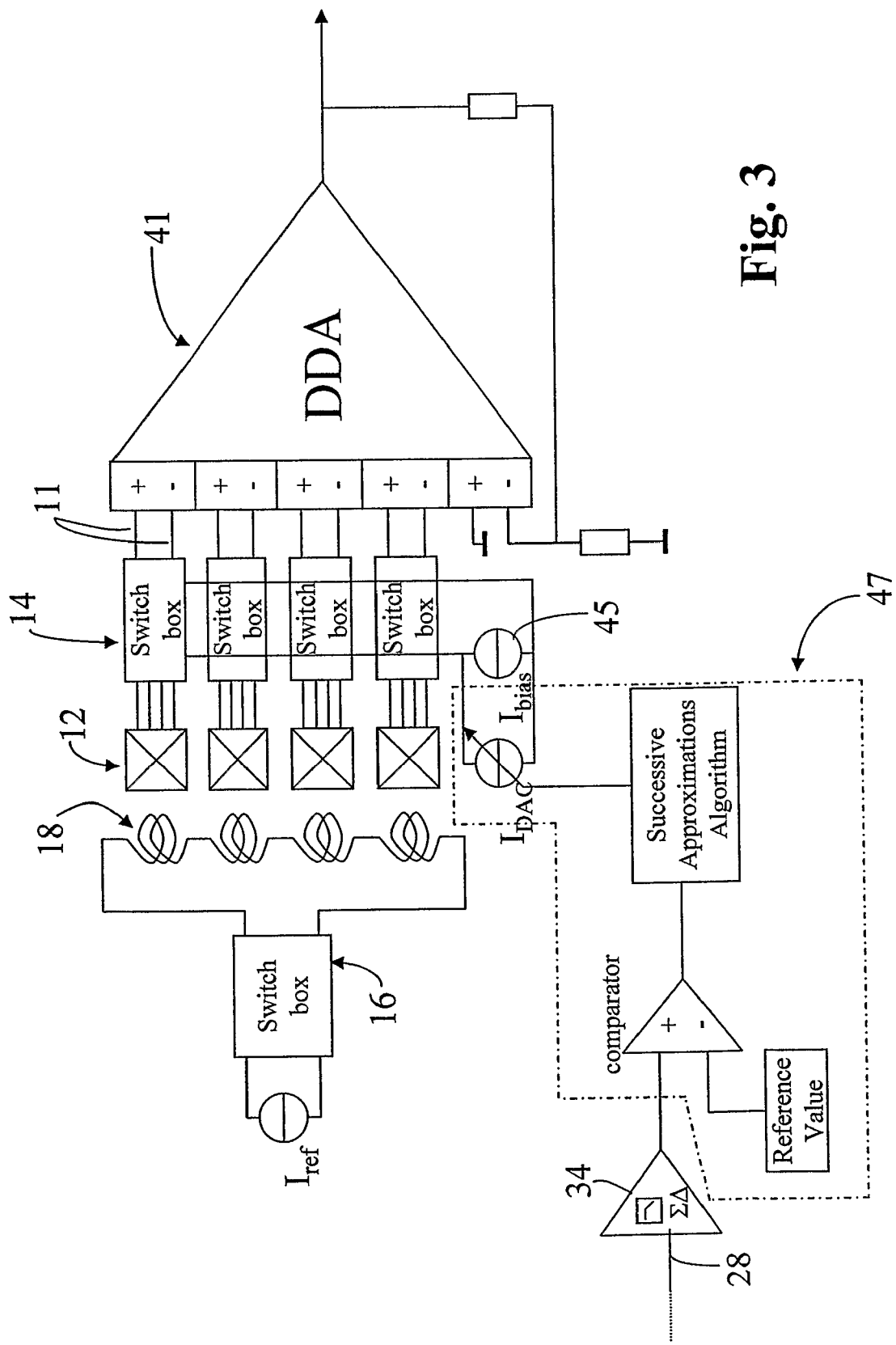
FIG. 3 is a schema illustrating a multiple reference magnetic field generator and a magnetic field sensor array connected to a multiple input differential difference amplifier (DDA) according to an embodiment of this invention.

Another embodiment for extracting the measurement and reference signals may be based on the use of a sensor element array, as illustrated in FIG. 3, showing four Hall effect sensors 12 subject to a reference magnetic field generated by the integrated reference coil or coils 18. The modulated outputs of the magnetic field sensing elements 12 are connected to the inputs of a differential difference amplifier (DDA) 41. With this arrangement, it is possible to extract the measurement and reference signals before the demodulating circuit 24, according to the scheme presented in FIG. 7c. In this scheme, during two phases, the reference signal is cancelled, whereas the measurement signal is added, and in two other phases, the measurement signal is cancelled and the reference signal added. This arrangement is particularly advantageous, since the measurement signal does not disturb the reference signal during the reference signal extraction because the sensor array cancels the measurement signal by subtracting values measured by the sensors.

Referring to FIG. 3, the switch boxes connect the sensing elements to the current bias source $I_{bias}$ 45 as well as to the DDA's inputs 11. Gain correction is made by adding or subtracting a variable current generated by a digital to analog converter 47 (DAC) to the constant bias current $I_{bias}$ 45. The DAC is controlled by a digital algorithm, which decides whether the current has to be increased or decreased, based on the comparison of the digital output value of the sigma-delta converter 34 with a constant reference.

In the schemes according to FIGS. 7a and 7b, the measurement and reference signals are both present when they are extracted in the demodulator, but this is not as advantageous as the modulation/demodulation technique leading to the schema of FIG. 7c, if the reference signal is significantly smaller than the measurement signal, since any variations in the measurement signal may have a disproportionately large effect on the reference signal extraction.

Figure 5:
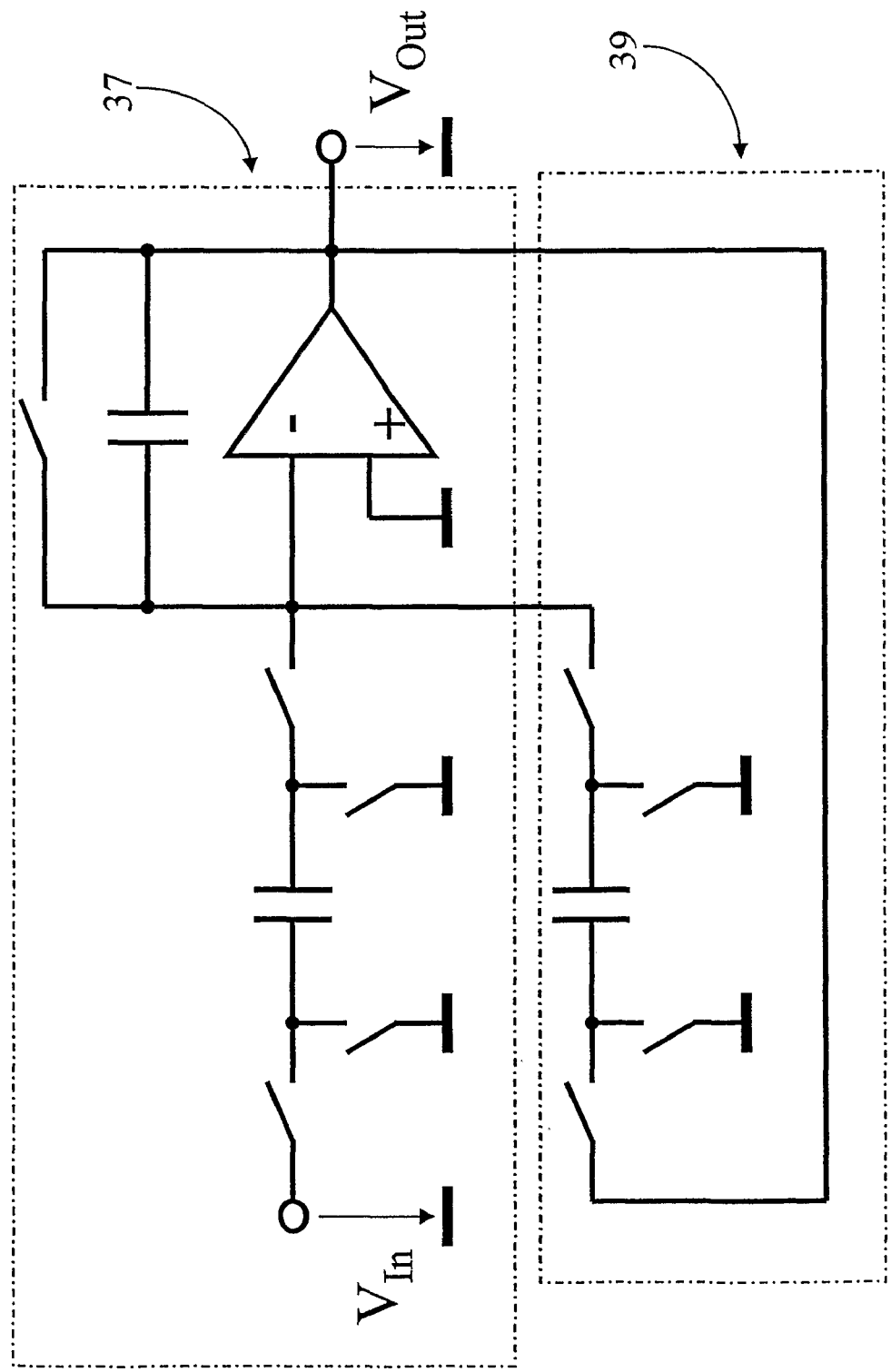
FIG. 5 is a circuit schema of a demodulator with low pass filter in the gain feedback line of the signal processing circuit.
Figure 6B:
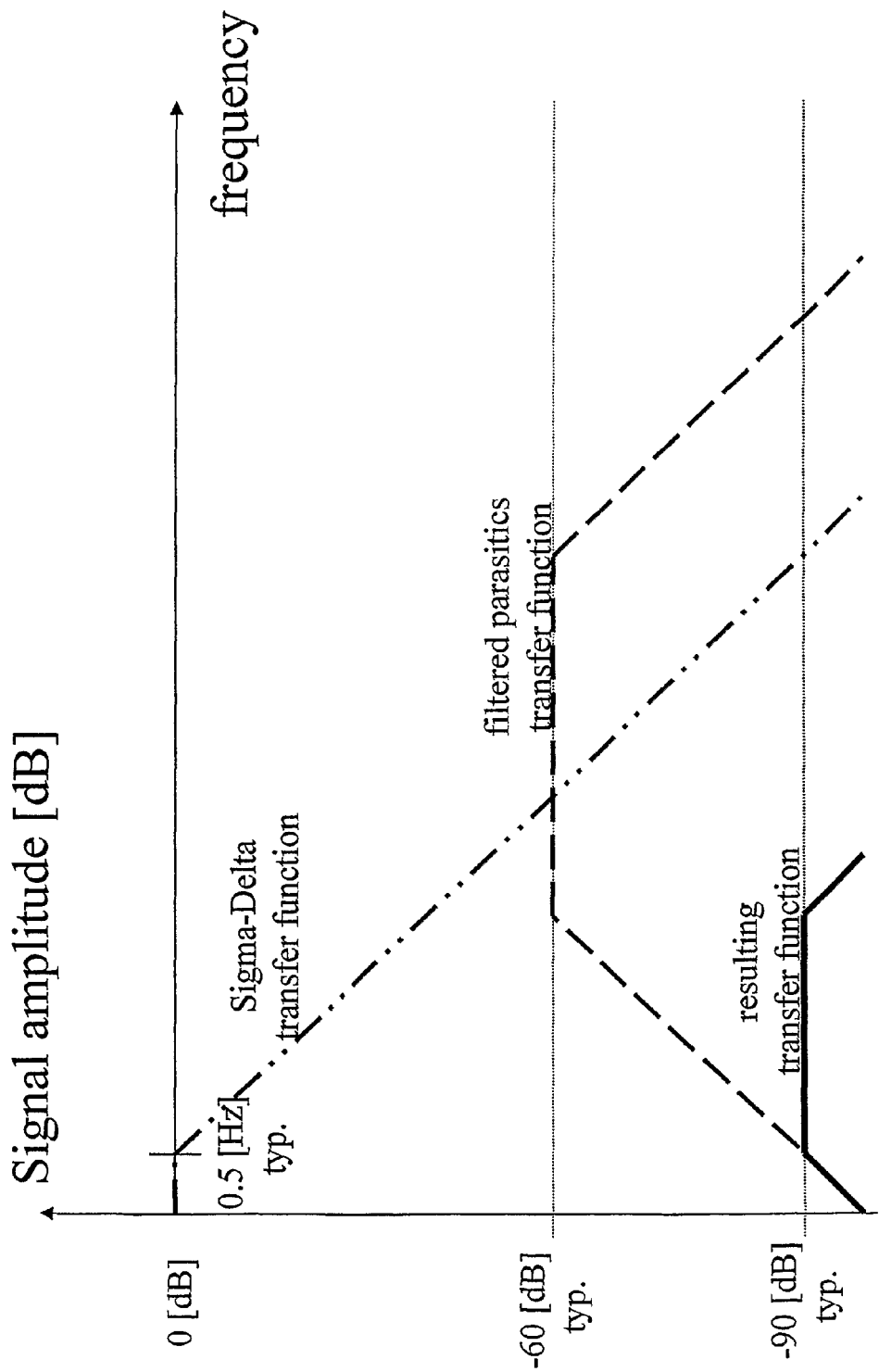
FIG. 6b is a graphical representation of the transfer functions of a Sigma-Delta converter and the parasitic signal transfer function after filtering on the feedback line.

Extraction of the reference signal used for gain correction may be further improved by adding a low pass filter 39 that could for example have the circuit design shown in FIG. 5, at the output of, or combined with, the demodulator 37. The low pass filter 39 helps to improve the signal to noise ratio, considering that the reference magnetic field $B_{ref}$ produced by the integrated coil 18 is very small relative to the external field to be measured $B_{ext}$. The total RMS noise would not allow for precise measurement without limiting the bandwidth. Another problem is the parasitic effect due to the signal to be measured being folded into the reference signal base band during modulation. The low frequency components of the signal are strongly attenuated, but the high frequency elements are not, leading to a high pass like parasitic transfer function as shown in FIG. 6a. The low pass filter 39 with a very low cut-off frequency, for example of 500 Hz, as shown in FIG. 6a, thus strongly attenuates noise whereby the reference signal remains unchanged since it is an appropriately modulated signal. FIG. 6a shows the parasitic signal component arising from the aliasing of the external signal component in the reference signal in the reference demodulator. The raw transfer function (without special circuitry to attenuate it) is high-pass like. This function strongly affects circuit performance, particularly if the external signal is in the order of magnitude of 100 times the reference signal. To attenuate the parasitics, a low-pass filter is included in the demodulator, and/or the demodulator is followed by a low-pass filter. The resulting transfer function is band-pass like. If this resulting signal is further low-pass filtered by the sigma-delta modulator 34, the peak parasitic amplitude can still be more reduced and made negligible as illustrated in FIG. 6b. The filtering is then band-pass like, with first-order attenuation up to the spinning current frequency, and then second-order attenuation.

Figure 4A:
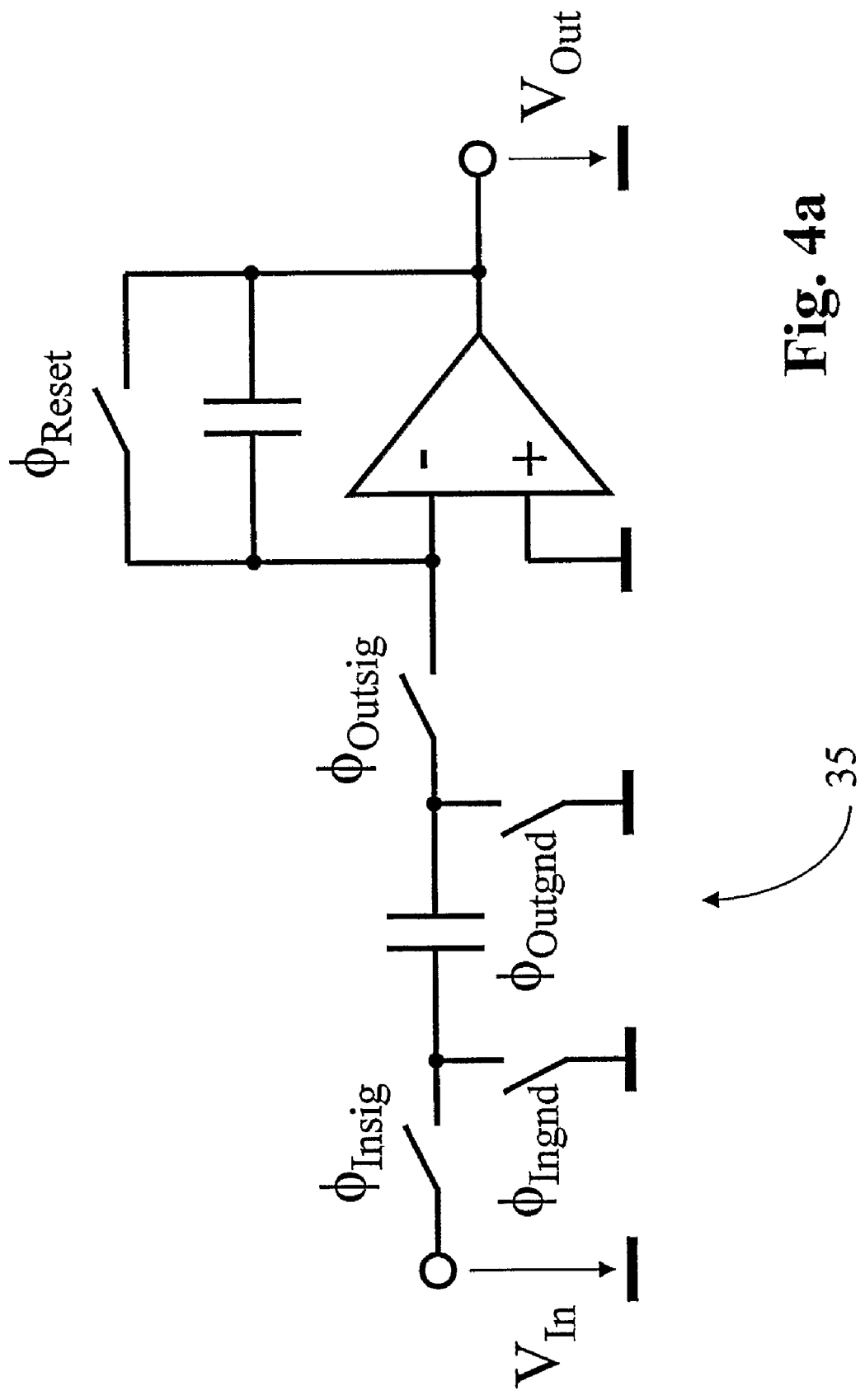
FIG. 4a is a circuit schema of a demodulator of signal processing circuit of the magnetic field sensor according to this invention.

The demodulators 24 may have the circuit design shown in FIG. 4a, which is a conventional switched-capacitors demodulator that can perform additions and subtractions.

Figure 4B:
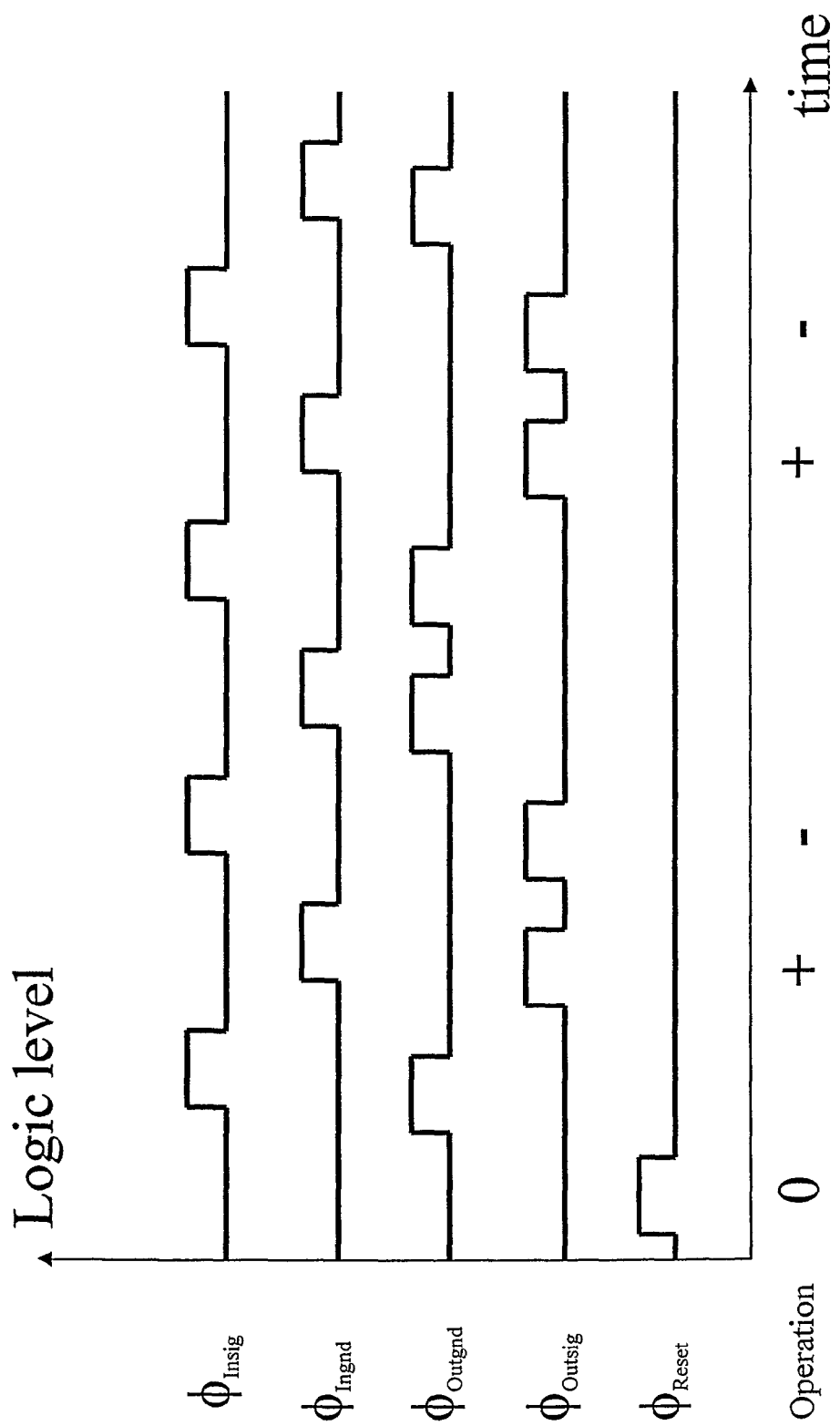

FIG. 4b shows an example of the command signals that have to be applied to the demodulator switches of FIG. 4a in order to apply the +−+− demodulation scheme presented in FIG. 7a and which allows to extract the external signal to be measured 4 $B_{ext}$.

The circuit shown in FIG. 5 serves as a demodulator as well as a low-pass filter, and comprises a demodulator circuit portion as shown in FIG. 4a, to which has been added a filter circuit portion 39 on a feedback path that makes this modified demodulator act as a low-pass filter.

The extracted reference signal may advantageously be digitalized by a sigma-delta modulator 34, which allows for further low pass filtering in the digital domain. The digital measurement of the gain serves to adjust the gain of the overall system by means of a digital-to-analogue converter (DAC) that generates the compensation current necessary to correct the gain error.

The sigma-delta converter is used as an integrator, which makes it naturally a low-pass filter. The demodulated and filtered reference signal coming from the demodulator is added periodically (once every 4 cycles, when the demodulated value is calculated), and a constant reference voltage is added or subtracted periodically, typically every cycle, in order to bring the sigma-delta output to zero. It will thus oscillate around zero, and at the end of the integration period, since the sigma-delta output will be almost zero, the mean of the reference signal samples will be equal to the difference between the positive and negative steps. This count is kept by the sigma-delta control circuitry and fed to its digital output.

$$\Sigma V_{de\,mod} = \Sigma (k_{plus} - k_{minus}) \cdot V_{ref} + \epsilon$$

where:

$k_{plus} - k_{minus}$ =Sigma delta digital output value;

$k_{plus} + k_{minus}$ =number of steps during the conversion (typically 1 step every microsecond during 1 second=1 million);

$\epsilon < V_{ref}$;

$V_{demod}$ is the output of the demodulator/filter, which is connected to the sigma-delta input;

$V_{ref}$ is the constant reference voltage controlling the gain of the sigma-delta;

$k_{plus}$ is the number of times $V_{ref}$ has been added during the integration time, which is typically 1 second;

$k_{minus}$ is the number of times $V_{ref}$ has been subtracted during the integration time;

$\epsilon$ is the total quantization error.

The magnetic field sensor according to this invention may be used in many different applications, for example as a position sensor, a terrestrial field compass, a sensor for measuring the magnetic field of electromagnetic motors, and as an electrical current sensor. In electrical current sensing applications, the electrical current flowing in a primary conductor generates a magnetic field that is proportional to the current to be measured. The electric current sensor may, or may not, comprise a magnetic core made of a material having a high magnetic permeability, surrounding the primary conductor such that the core acts as a magnetic field concentrator. In current sensors comprising a magnetic core, the magnetic field sensing cell may advantageously be positioned in an air-gap of the magnetic core. The magnetic core preferably surrounds the primary conductor. Measurement of the magnetic field can thus be correlated to an electrical current for use of the magnetic field sensor described hereinabove as an electrical current sensor.

The magnetic field sensor according to this invention, in view of the separation of the signals obtained from the external magnetic field and the reference magnetic field, and the effective suppression of parasitic signals in the feedback loops, allows an electrical current with a large frequency range to be measured, ranging from 0 to around 100 kHz.

The invention claimed is:

1. Magnetic field sensor comprising a reference magnetic field generator, a magnetic field sensing cell including a magnetic field sensing element, and a signal processing circuit connected to an output of the magnetic field sensing cell and comprising one or more feedback lines for correcting error fluctuations in the transfer characteristic of the magnetic field sensor, the reference magnetic field generator adapted to generate a frequency modulated reference magnetic field, wherein the signal processing circuit further includes a modulator connected to the magnetic field sensing cell, the modulator modulating the output signal thereof at a frequency different from the modulation frequency of the reference magnetic field generator.

2. Sensor according to claim 1, wherein the reference magnetic field modulator and magnetic field sensing cell modulator are adapted to switch the connections of inputs, whereby the frequency of switching of one of said modulators is an integer multiple of the frequency of switching of the other modulator.

3. Sensor according to claim 2, wherein the integer multiple is two.

4. Sensor according to claim 1, wherein the magnetic field sensing cell comprises a plurality of magnetic field sensing elements.

5. Sensor according to claim 4, wherein the plurality of magnetic field sensing elements are in the form of an array of Hall effect sensors in an integrated circuit.

6. Sensor according to claim 4, wherein the reference magnetic field generator is in the form of an array of coils in an integrated circuit.

7. Sensor according to claim 4, wherein there are four magnetic field sensing elements.

8. Sensor according to claim 1, wherein the magnetic field sensing cell is connected, after modulation, to inputs of a differential difference amplifier (DDA).

9. Sensor according to claim 1, comprising a signal processing circuit portion including a demodulating circuit.

10. Sensor according to claim 9, wherein the demodulating circuit has an input connected to an output of an amplifying circuit connected to the magnetic field sensing cell, and at an output connected to said one or more feedback lines and to an output line of the sensor.

11. Sensor according to claim 10, wherein the demodulating circuit comprises a separate demodulator for each feedback line and output line.

12. Sensor according to claim 9, wherein said one or more feedback lines includes a gain correction feedback line feeding into a gain correction input of the magnetic field sensing cell.

13. Sensor according to claim 12, further comprising a low pass filter after a demodulator of the demodulating circuit, or integrated with the demodulator, on the gain correction feedback line.

14. Sensor according to claim 12, wherein the gain correction feedback line comprises a sigma-delta analog to digital converter for digitalizing the demodulated gain correction feedback signal.

15. Sensor according to claim 1, wherein said one or more feedback lines includes an offset correction feedback line feeding into an offset adjustment input of the amplifier circuit.

16. Sensor according to claim 15, wherein the offset correction feedback line is connected to an output of a demodulating circuit.

17. Electrical current sensor for measuring an electrical current flowing in a conductor by measuring an external magnetic field generated by the current to be measured, the electrical current sensor comprising a magnetic field sensor according to claim 1.

18. Electrical current sensor according to claim 17, comprising a magnetic core made of a material with high magnetic permeability and having an air-gap in which the magnetic field sensing cell is positioned.

19. Method of measuring an external magnetic field, including the steps of superimposing a modulated reference magnetic field on the external magnetic field, modulating the output signal of a magnetic field sensing cell at a frequency different from the modulation frequency of the reference magnetic field, and adding or subtracting different phases of the modulated signal in order to separately extract a measurement signal corresponding to the external magnetic field and a reference signal corresponding to the reference magnetic field.

20. Method according to claim 19, wherein the modulation frequency of the modulated reference magnetic field is different from the modulation frequency of the modulated magnetic field sensing cell signal by an integer multiple.

21. Method according to claim 20, wherein the integer multiple is two.

* * * * *